(12) United States Patent
Ferguson et al.

(10) Patent No.: US 11,474,184 B2
(45) Date of Patent: Oct. 18, 2022

(54) MINIMIZATION OF EFFECTS OF CONCOMITANT FIELDS IN MULTI ECHO IMAGING

(71) Applicant: Siemens Healthcare GmbH, Erlangen (DE)

(72) Inventors: George William Ferguson, Erlangen (DE); Michael Koehler, Nuremberg (DE); Constantin von Deuster, Zurich (CH)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/891,689

(22) Filed: Jun. 3, 2020

(65) Prior Publication Data

US 2020/0379073 A1 Dec. 3, 2020

(30) Foreign Application Priority Data

Jun. 3, 2019 (EP) ..................................... 19177874

(51) Int. Cl.
*G01R 33/565* (2006.01)
*G01R 33/561* (2006.01)

(52) U.S. Cl.
CPC ... *G01R 33/56545* (2013.01); *G01R 33/5617* (2013.01); *G01R 33/56581* (2013.01)

(58) Field of Classification Search
CPC ........ G01R 33/56545; G01R 33/56581; G01R 33/5617; G01R 33/543
See application file for complete search history.

(56) References Cited

U.S. PATENT DOCUMENTS

| 5,623,207 | A | 4/1997 | Weissenberger et al. |
| 5,869,965 | A * | 2/1999 | Du .................... G01R 33/56581 |
| | | | 324/309 |
| 6,008,647 | A | 12/1999 | Zhou et al. |
| 2002/0135366 | A1 | 9/2002 | Heubes |
| 2016/0274207 | A1* | 9/2016 | Kondo ............. G01R 33/56518 |

(Continued)

FOREIGN PATENT DOCUMENTS

EP 3715896 A1 9/2020

OTHER PUBLICATIONS

Bernstein, M. A. et al. "Handbook of MRI pulse sequences", Elsevier Academic Press, pp. 296, 2004.

(Continued)

*Primary Examiner* — Rishi R Patel
(74) *Attorney, Agent, or Firm* — Banner & Witcoff Ltd.

(57) ABSTRACT

The present disclosure relates to operating an MR system in which MR signals of an object under examination are acquired in an examining region using a multi echo imaging sequence, in which an RF excitation pulse and a plurality of RF refocusing pulses are applied. The techniques include determining a first accumulated phase of a magnetization in the object under examination. Then, a second accumulated phase of the magnetization in the object under examination is determined due to concomitant magnetic fields occurring between a second pair of consecutive RF pulses. Finally, it is determined whether a deviation from the predefined relationship is larger than a threshold and, if this is the case, a measure is applied in view of the fact that the deviation is larger than the threshold.

19 Claims, 3 Drawing Sheets

(56) References Cited

U.S. PATENT DOCUMENTS

2016/0363643 A1 12/2016 Umeda
2020/0309886 A1 10/2020 von Deuster et al.

OTHER PUBLICATIONS

Zhou, Tan, Bernstein: "Artifacts induced by concomitant magnetic field and in fast spin-echo imaging", Magnetic Resonance in Medicine, vol. 40, p. 582-591 1998.
European Search Report dated Jan. 7, 2020, Application No. 19177874.5.

* cited by examiner

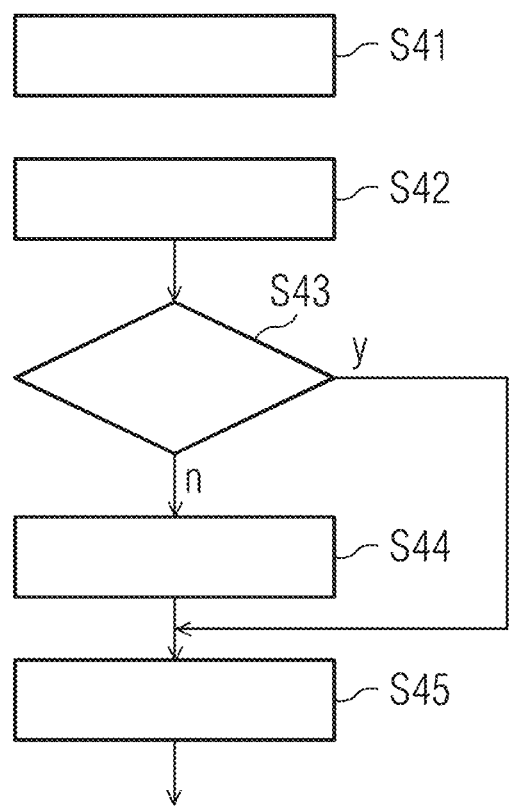

MINIMIZATION OF EFFECTS OF CONCOMITANT FIELDS IN MULTI ECHO IMAGING

CROSS-REFERENCE TO RELATED APPLICATIONS

The present application claims the benefit of the filing date of European patent application no. EP19177874.5, filed on Jun. 3, 2019, the contents of which are incorporated herein by reference in their entirety.

TECHNICAL FIELD

The disclosure relates to a method for operating a magnetic resonance (MR) system in which MR signals of an object under examination are to be acquired using a multi echo imaging sequence. Furthermore, the corresponding MR system is pro-vided, a computer program comprising program code and a carrier comprising the computer program.

BACKGROUND

In MR imaging systems, multi-echo sequences are known in which after a single RF excitation pulse, several refocusing pulses are applied to generate several spin echoes. This kind of imaging sequence is also known as a fast or multi spin echo imaging sequence. A typical sequence diagram is shown in FIG. 1, in which after one excitation pulse 30 several refocusing pulses 31 to 34 are applied to generate the spin echoes 41 to 43. Gradients in the slice selection direction are applied, such as gradients 50 and 51, in which gradient 51 already comprises the "crushers" to suppress unwanted signal components, such as the free induction decay, FID. As known, gradients 60 and 61 with different amplitude are played out in the phase encoding direction, and the spin echo is acquired during the readout gradients 71, in which gradient 70 is applied to have a rephased signal at the echo time. The different RF pulses are played out at the times t0 to t4 as indicated in FIG. 1.

One problematic effect coming along with such a typical realization of fast spin echo sequences is the following:

Concomitant Fields

Typical gradients are designed to cause a variation of the static magnetic field B0 in one direction. The main magnetic field is usually aligned in one direction, typically referred to as the z-direction. Then, e.g. the x-gradient shall lead to a variation of the B0 field in the x-direction. However, it follows from Maxwell's equations that the application of gradients gives rise to components of the magnetic field that are not aligned in the z-direction. Further, the magnitude of the z-component of the magnetic field is affected. These additional field components are referred to as "concomitant fields" or "Maxwell terms" (see e.g. Bernstein, Matt A., King, Kevin F., and Zhou, Xiaohong Joe: "Handbook of MRI pulse sequences", Elsevier, 2004). For cylindrical MR scanners, one can approximate the concomitant fields BC as follows:

$$BC(t) = \frac{1}{2B0}\left[\left(Gx(t)\,z - \frac{Gz(t)\,x}{2}\right)^2 + \left(Gy(t)\,z - \frac{Gz(t)\,y}{2}\right)^2\right] \quad (1)$$

Therein, B0 is the static magnetic field, x/y/z are the spatial coordinates, and Gx/Gy/Gz are the gradients applied in these directions. It follows that the effects decrease with increasing amplitude of the static B0 field.

The time-integral of the concomitant fields causes a phase accumulation, which can lead to destructive interference in fast spin echo measurements.

$$\Phi_c(t0,t1) = \gamma \int_{t0}^{t1} BC(t)dt \quad (2)$$

This can happen if the phase accumulation is different for the different echo paths. For instance, the magnetization that forms the stimulated echo can experience a different amount of accumulated phase than the magnetization that forms the spin echo. As the signals of these two "paths" are usually superimposed in fast spin echo measurements from the second echo onwards, a destructive interference of these configurations can cause signal loss. A schematic illustration of this effect is shown in FIG. 2.

FIG. 2 shows the phase evolution for the normal spin echo path 81, in which the phase evolution path 82 is provided for the stimulated echo path. The bracket 80 then describes the destructive interference between the stimulated echo path and the spin echo path

SUMMARY

Accordingly, a need exists to overcome the abovementioned problem and to provide an MR system with a multi echo imaging sequence in which the influence of concomitant fields is minimized. This need is met by the features of the aspects as described herein as well as the features recited in the claims.

According to a first aspect, a method for operating an MR system is provided in which MR signals of an object under examination are to be acquired in an examining region using a multi echo imaging sequence, in which an RF excitation pulse and a plurality of RF refocusing pulses are applied. According to a first step, a first accumulated phase of a magnetization in the object under examination due to concomitant magnetic fields is determined, which occurs between a first pair of consecutive RF pulses of the applied RF pulses in at least one location within the examining region. Furthermore, a second accumulated phase of the magnetization is determined in the object under examination, which is occurring due to the concomitant magnetic fields between a second pair of consecutive RF pulses of the applied RF pulses in the at least one location within the examination region, in which a predefined relationship exists between the first accumulated phase and the second accumulated phase. Furthermore, it is determined whether a deviation from the predefined relationship is larger than a threshold. If this is the case, a measure is applied or suggested to the user in view of the fact that the deviation is larger than the threshold. As used herein, the term "measure," may include any suitable executed action, notification, or information that may be presented to the user. Thus, the various measures as described herein may include automatically or-semi-automatically executed steps or actions in response to the deviation, the notifications and/or information presented to a user based upon the deviation being detected, as well as manual steps or actions a user may take in response to the notification or information that is presented.

With this automated method, the effects of the concomitant fields can be calculated for different locations within the examining region so that it can be determined in advance, before the MR signals are acquired with the multi echo imaging sequence. Accordingly, measurements leading to a bad image quality due to the signal loss can be prevented.

It is possible that the first and the second accumulated phases are determined using the gradient strength values to be used in the multi echo imaging sequence.

Here, the gradient values of the desired imaging sequence can be considered. Based on the gradient values, it is possible to predict to what extent the concomitant fields will influence the acquired MR signals.

In case the deviation from the predefined relationship is larger than the threshold, different options exist to compensate the signal loss:

It is possible that a user of the MR system is informed that the deviation is larger than the threshold. Furthermore, it is possible that the system automatically reacts, e.g. it is possible that the time between the plurality of RF refocusing pulses is increased. Furthermore, the assignment of a gradient in the readout direction and a gradient in the phase encoding direction applied to the physical gradient axis could be changed, meaning that the read out direction becomes the phase encoding direction, and vice versa. Furthermore, it is possible to apply a bipolar gradient consisting only of two gradient lobes in a readout direction between the RF excitation pulse and a first one of the plurality of refocusing pulses. Furthermore, it is possible to deactivate a possible flow compensation, which might be active in at least one of the gradient directions.

The different options discussed above may also be combined. Furthermore, the different options may be displayed to the user so that the user can decide which measures to take.

The first and second accumulated phase may be determined in a plurality of locations within the examining region. It can then be determined whether the deviation is larger than the threshold for each of the plurality of locations, and the measure or measures discussed above may be applied when the deviation is larger than the threshold in at least one of the plurality of locations.

This means that if the deviation is larger than the threshold in any of the locations, the above discussed countermeasures may be applied. Accordingly, this helps to assure that in none of the locations the influence of the concomitant fields is larger than a certain value. The first accumulated phase and the second accumulated phase may be determined taking into account the gradients applied in a readout direction and a slice selection direction wherein the gradients applied in a phase encoding direction may be disregarded.

The values of the physical gradients that are used for the calculation can be based on the gradients that are applied in at least one of the axes such as slice selection, phase encoding, or readout. The readout and the slice selection directions may be considered individually or a combination of both.

As far as the locations are concerned, where the first and the second phase are determined, it is possible to use a hypothetical field of view in the examining region in which the signal losses due to the concomitant fields should be smaller than a predefined signal loss. This hypothetical field can have a spherical, cylindrical, ellipsoidal, or cubical shape.

Furthermore, it is possible to use a central location of a current field of view which is used for the multi spin echo sequence. In addition, locations or points located on an edge of the current field of view may be selected for the calculation.

The threshold defining the difference between the first and second accumulated phase can be a fixed value, or can be based on current operating conditions at which the multi spin echo sequence will be acquired.

The first accumulated phase can be determined between the RF excitation pulse and a first of the refocusing pulses, in which the second accumulated phase may be determined between two consecutive RF refocusing pulses.

In this context, the predefined relationship indicates that the first accumulated phase is half of the second accumulated phase as shown by the following equation 3.

$$\Phi_c(t0,t1) = \tfrac{1}{2}\Phi_c(t1,t2) = \ldots = \tfrac{1}{2}\Phi_c(tn-1,tn)$$

$$\int_{t0}^{t1} BC(t)dt = \tfrac{1}{2}\int_{t1}^{t2} BC(t)dt = \ldots = \tfrac{1}{2}\int_{tm-1}^{tm} BC(t)dt \qquad (3)$$

The first accumulated phase and the second accumulated phase may be determined with $\Phi_c$ and as BC(t) defined in equations (1) and (2) above, i.e. using the equations:

$$BC(t) = \frac{1}{2B0}\left[\left(Gx(t)\, z - \frac{Gz(t)\, x}{2}\right)^2 + \left(Gy(t)\, z - \frac{Gz(t)\, y}{2}\right)^2\right] \qquad (1)$$

$$\Phi_c = \gamma \int BC(t)dt \qquad (2)$$

Furthermore, an MR system configured to acquire the MR signals of the object under examination is provided in which the MR system comprises a control unit configured to operate the MR system as discussed herein.

Additionally, a computer program comprising program code is provided which, when executed by the control unit of the MR system, causes the MR system to perform the method as discussed herein.

Additionally, a carrier comprising the computer program is provided, wherein the carrier is one of an electronic signal, optical signal, radio signal, or a non-transitory computer readable storage medium storing the program code or other executable instructions that may cause one or more processors, the MR system, and/or the control unit to perform the method as discussed herein.

It should be understood that the features mentioned herein may be used not only in the respective combinations indicated, but also in other combinations without departing from the scope of the present application. Features of the aspects as described herein may be combined with each other in other combinations, unless explicitly mentioned otherwise.

BRIEF DESCRIPTION OF THE DRAWINGS/FIGURES

The foregoing and additional features and effects of the application will become apparent from the following detailed description, when read in conjunction with the accompanying drawings, in which like reference numerals refer to like elements.

FIG. 4 shows an example schematic flowchart of a method carried out by an MR system to avoid the signal losses in the multi echo imaging sequence, in accordance with various aspects of the present disclosure.

DETAILED DESCRIPTION

Figure 1:
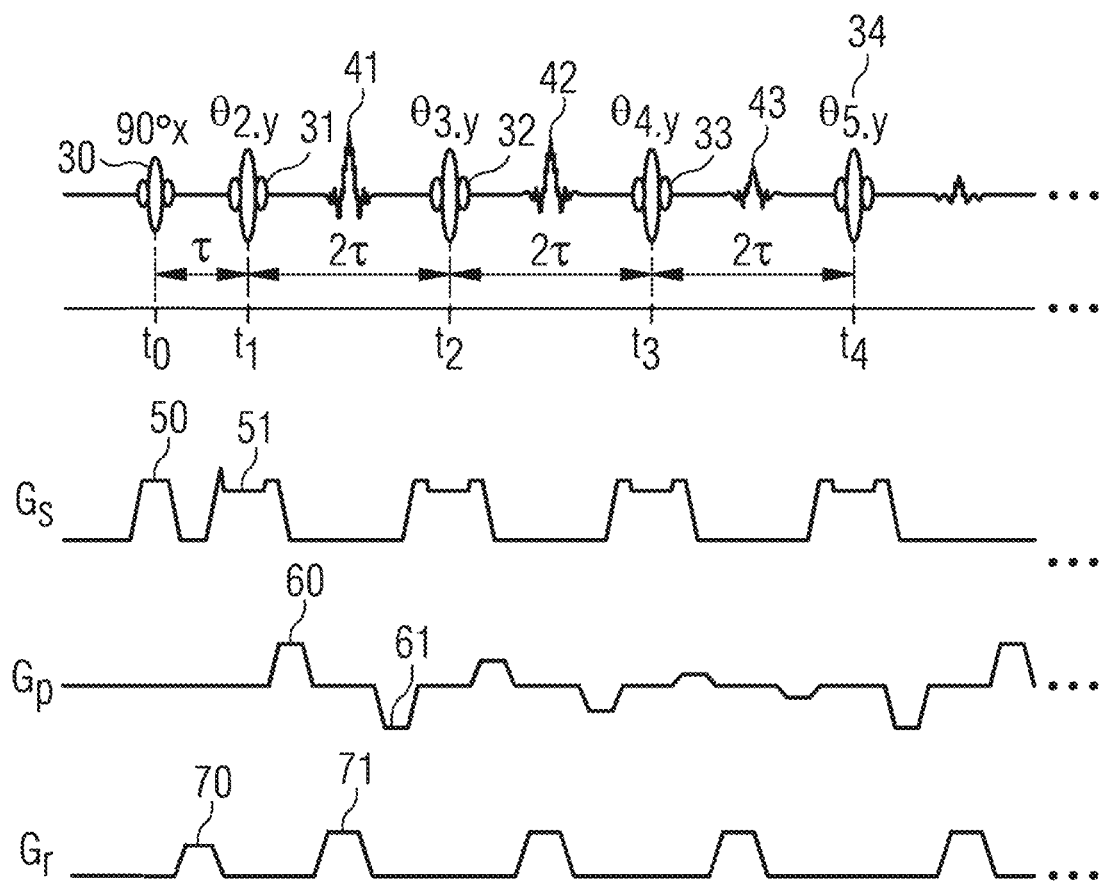
FIG. 1 shows a schematic view of a spin echo imaging sequence as known in the art.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are to be illustrative only.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof. Moreover, the various functional blocks, devices, components of physical or functional units shown in the drawings and described herein may be implemented as any suitable number and type of computer processors, and may alternatively be referred to as a "system," "circuitry," or a "device."

To avoid destructive interferences between different echo paths in multi spin echo sequences, the phases that are accumulated between consecutive refocusing RF pulses should be equal, and they should be twice the phase accumulated between the excitation RF pulse and the first RF refocusing pulse as can be deduced from the following equation 3:

$$\int_{t0}^{t1} Bc(t)dt = \tfrac{1}{2}\int_{t1}^{t2} BC(t)dt = \ldots = \tfrac{1}{2}\int_{t_{m-1}}^{t_m} Bc(t)dt \qquad (3)$$

Therein, t0 denotes the time of the excitation RF pulse, the other times, t1, t2 denote the time points of the refocusing pulses where each time refers to the center of the respective RF pulse as shown in FIG. 1. A deviation from this condition might cause the degradations of the image quality as discussed above. In the present context, these degradations depend on the position or coordinates x, y, z set in the image region and thus the field of view, the orientation of the field of view, and the correspondence of the logical readout gradients, phase encoding gradients, and slice selection gradients to the physical gradient axes Gx, Gy, Gz.

A method to avoid signal loss due to destructive interference in fast spin echo measurements caused by concomitant fields is published in U.S. Pat. No. 5,623,207 A. This patent formulates the basic condition to avoid destructive interference caused by concomitant fields in equation 4 as follows:

$$\int_{t0}^{t1} G^2(t)dt = \tfrac{1}{2}\int_{t1}^{t2} G^2(t)dt = \ldots = \tfrac{1}{2}\int_{t_{m-1}}^{t_m} G^2(t)dt \qquad (4)$$

G(t) are the applied gradients. Accordingly, the above equation (4) formulates the condition that the integral of the squared gradient between the excitation and the first RF refocusing pulse should be half of the corresponding integral between consecutive refocusing RF pulses. Equations (3) and (4) above are equivalent when restricting the case to one physical gradient axis.

In common technical realizations, it is aimed to fulfill the condition formulated by equation (4) as far as possible. Often, this consideration is restricted to one logical gradient axis, by way of example by fulfilling the above condition for the readout gradients and/or the slice selection gradients individually. Sometimes, other constraints exist such as the desire to maintain the time interval between consecutive refocusing RF pulses as short as possible. Here, the above condition might not be fulfilled completely, even not for a single gradient axis.

Figure 2:
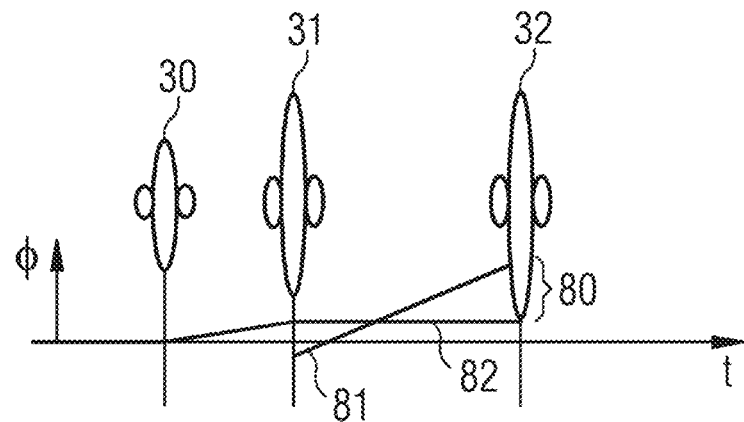
FIG. 2 shows a schematic view of the phase accumulation caused by the concomitant fields for the spin echo and stimulated echo in the imaging sequence of FIG. 1.
Figure 3:
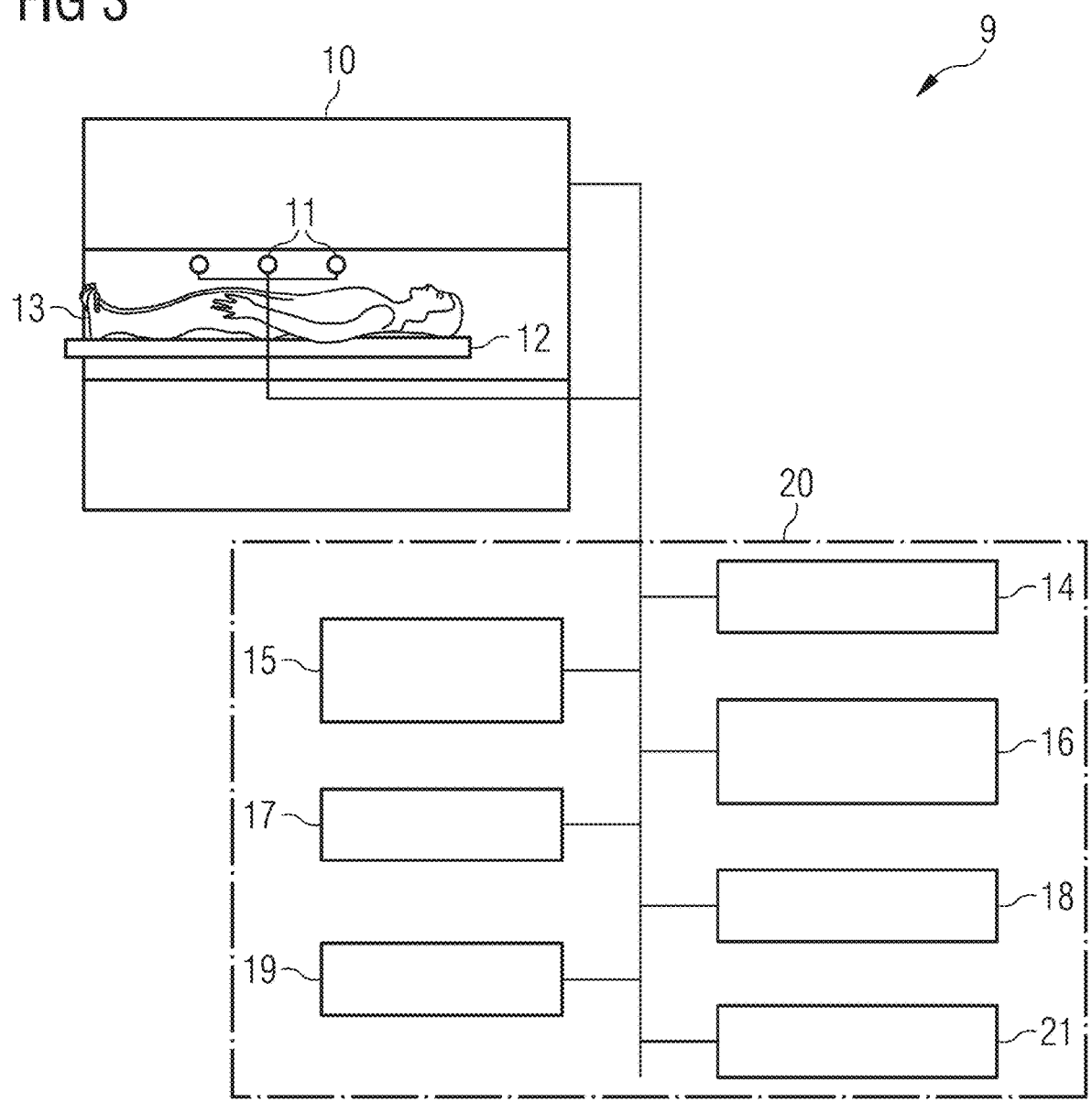
FIG. 3 shows a schematic view of an example MR system configured to overcome the signal losses due to the concomitant fields by calculating the phase evaluation due to concomitant fields and by applying measures if needed, in accordance with various aspects of the present disclosure.

FIG. 3 shows a schematic view of an MR system 9, which comprises a magnet 10 (also referred to herein as a main magnet or MR scanner) generating a polarization field B0. An object under examination 13 lying on a table 12 is moved into the center of the MR system 9, where MR signals after RF excitation can be detected by receiving coils 11 that may comprise different coil sections, in which each coil section can be associated with a corresponding detection channel By applying RF pulses and magnetic field gradients, the nuclear spins in the object 13, especially the part located in the receiving coil, are excited and location coded and the currents induced by the relaxation can be detected. The manner in which MR images are generated and how MR signals are detected using a sequence of RF pulses and the sequence of magnetic field gradients is known in the art and was discussed above in connection with FIGS. 1 and 2, so that a detailed explanation is not necessary for purposes of brevity.

The MR system 9 comprises a control unit 20 that is used for controlling the MR system. The control unit 20 comprises a gradient control unit 14 for controlling and switching the magnetic field gradients, and an RF control unit 15 for controlling and generating the RF pulses for the imaging sequence. An imaging sequence control unit 16 is provided, which controls the sequence of the applied RF pulses and magnetic field gradients, and thus controls the gradient control unit, the RF control unit, and the receiving coils 11. In a memory 17, computer programs, instructions, and/or code needed for operating the MR system and the imaging sequences necessary for generating the MR images can be stored together with the generated MR images. The generated MR images can be displayed on a display 18, in which an input unit or human-machine interface 19 is provided used by a user of the MR system to control the functioning of the MR system. A processing unit 21 includes one or more processors, which can carry out instructions stored on the memory 17. The memory can further include any suitable program code to be executed by the processing unit 21. The processing unit can, based on the detected images, reconstruct an MR image.

As will be discussed below, the control unit 20 and/or the processing unit 21 may be configured such that the phases due to the concomitant fields are determined, and it is checked whether there is a deviation from a known relationship between the two accumulated phases. If the deviation is larger than a threshold, different steps may be carried out to avoid the signal loss due to the concomitant fields.

As will be discussed below, the deviation from equation (3) mentioned above is automatically determined by the MR system, by way of example by the processing unit 21. To this end, the information of the currently-chosen field of view (FoV) and the image orientation determines the correspondence of the logical gradients to the physical gradients Gx, Gy, Gz. The MR system then compares the deviation from equation (3) to a threshold that can be a predetermined threshold or a sequence parameter dependent threshold. Based on this threshold, the MR system either informs the user about the mismatch or automatically modifies sequence parameters to mitigate the mismatch.

In the following, the method will be discussed below with several variants which may be combined:

1. The accumulated phases $\Phi_c$ due to concomitant fields between consecutive RF pulses are calculated using equations (1) and (2). It is possible to calculate several values $\Phi_c$ based on several spatial points of interest.
   A. As the phase encoding gradients vary between the different RF pulses, in one embodiment these are neglected to simplify the considerations. Then, the accumulated phases between consecutive refocusing RF pulses are usually identical. Therefore, only two values have to be calculated: $\Phi_{c,exc}$ (between the excitation pulse and the first refocusing RF pulse) and $\Phi_{c,refoc}$ (between consecutive refocusing RF pulses).
   B. The values of the physical gradients Gx/Gy/Gz that are used for the calculations are based on the gradients applied on at least one "logical" axis (=slice selection, phase encoding or readout). Embodiments described herein consider the readout and slice selection gradients individually or the combination of these two.

The spatial coordinates x/y/z to calculate the accumulated phase can be based on one or more of the following.
   C. Pre-defined values, which define a hypothetical FoV, in which measurements without too severe signal losses due to concomitant fields can be guaranteed. This hypothetical FoV can have any suitable shape, such as e.g. a spherical, cylindrical, ellipsoidal, cubical shape, etc. Then, either single extreme values of the coordinates inside this volume are used or multiple values are used. In the latter case, the accumulated phases are calculated for each of the values that are used.
   D. Average (=central) values of the currently selected FoV.
   E. Extreme values of the currently selected FoV: coordinates of one or several points on the edge of the currently selected FoV. If several values are used, the accumulated phases are calculated for each of the values that are used.
   F. Average (=central) or extreme values of a part of the currently selected FoV, where this part is determined by a previous MR measurement, e.g. an adjustment measurement which is routinely applied before a clinical measurements to adjust measurement parameters. Alternatively, so-called "localizer" or "scout" measurements can be used. Such measurements are commonly applied as a first step at the beginning of a patient examination and are (according to conventional techniques) able to provide information of relevant organs by identifying certain landmarks in the obtained images. Such measurements are frequently used to perform an automatic positioning of the imaging FoV to match it to certain diagnostically-relevant organs or body parts. Hence, these predetermined relevant subparts of the selected imaging FoV can be used to define the relevant coordinates for the calculation proposed here. Another option is to apply a well-suited masking algorithm to simply identify the subpart of the selected FoV where the signal appears, and then to use this regions to define the relevant coordinates (again, either by using average or extreme values).

2. The accumulated phases calculated in step 1 may be further processed to calculate deviations from Eq. (3). Resulting differences $\Delta\Phi_i$ between the potentially different subequations may then be calculated in various ways.
   A. In the embodiment according to step 1A, this is equivalent to calculating the difference $\Delta\Phi = 2\Phi_{c,exc} - \Phi_{c,refoc}$ (potentially for different spatial points of interest).

3. The "deviations" calculated in step 2 are compared to a threshold. This threshold defines the maximum tolerable dephasing between different echo configurations. Possible thresholds may include values, e.g. such as $0.5\pi$ rad, $\pi$ rad, or $1.5\pi$ rad (where "rad" refers to radian).
   A. The threshold may be based upon a value in accordance with one or more of the various techniques as follows.
      i. Fixed or defined in a predetermined manner in the software used for controlling the MR system.
      ii. Dependent on other parameters (e.g., sequence parameters like the FoV or the organ or body part that is currently examined).
      iii. Modifiable by the user.
   B. In one embodiment, the largest possible integer multiple of $2\pi$ (considering a radian measured to quantify the accumulated phases) is subtracted from the calculated deviations $\Delta\Phi_i$ before comparing the values to the limit. Hence, only the physically relevant phase differences in the range of $0\ldots 2\pi$ are considered.

4. If the comparison performed in step 3 indicates that the limit is exceeded, one of the following measures is applied. The selection of the measure can depend on the degree of the $\Delta\Phi$ limit violation. Further, several options can be combined. By applying these measures, it is aimed to minimize or even null the deviation(s) calculated in step 2.
   A. The echo spacing (=the time between subsequent refocusing RF pulses) is prolonged. This also prolongs the time between the excitation and first refocusing RF pulses. It enables further degrees of freedom to design the gradients between the respective RF pulses. These degrees of freedom are then used to adjust the gradient pulses with respect to their amplitudes, durations, or ramp times to reduce the deviation calculated with step 2. The available time between the RF pulses is already used to minimize the deviation from equation (4). However, this does not take into account the spatial coordinates and the exact image orientation, which determines the relation between logical gradient axes and physical gradients Gx/Gy/Gz.
   B. The assignment of phase encoding and readout gradients to physical gradient axes is modified. For instance, the readout gradient is switched from the z-axis to the x-axis in coronal images. As the concomitant fields depend on the gradients and on the position, this "simple" change can mitigate the effects.
   C. A method as suggested in which a bipolar gradient consisting of two gradient lobes is played on the readout axis between the excitation and first refocusing RF pulse, together with a "balanced" gradient scheme (=compensated zeroth and first gradient moment) between the refocusing RF pulses.
   D. Flow compensation (e.g., on the read gradient axis) is deactivated, if it was selected originally. With flow compensation, the gradient patterns are designed to null the zeroth and first gradient moments. Together with the aim to obtain the shortest possible timing (i.e., echo spacings), this might conflict with the aim to minimize the effects of concomitant fields. The deactivation of flow compensation thus may help to mitigate the effects. Without flow compensation, there are more degrees of freedom to minimize destructive interferences.
   E. The user is notified that the selection of current protocol settings can lead to signal loss due to concomitant fields.

i. One of the aforementioned measures (4A-4D) is proposed to mitigate the effect. The user can decide to accept one of the measures or decline the suggestions.

ii. The user is informed about this unfavorable situation, without suggesting possible mitigations.

FIG. 4 provides a summary of the main step discussed above. In step S41, the accumulated phase due to the concomitant fields is determined to check whether the relationship in the phase evaluation corresponds to the predefined relationship. In step S42, the deviation between the accumulated phase is determined, e.g. the phase evaluation due to the concomitant fields between the excitation and the first refocusing pulse and the phase evaluation between the first and the second refocusing pulse. In step S43, it is checked whether the deviation from the relationship as known from equations (3) and (4) is smaller than a threshold. If this is not the case, several measures may be applied such as measures discussed above under item 4 based on the adaptation (step S44). The signal acquisition of the multi echo imaging sequence can then be carried out in step S45. If the deviation is smaller than a threshold in step S43, the method can directly continue with the image acquisition for the multi echo imaging sequence.

As discussed above, the effects of the concomitant fields can be calculated by considering both the gradient values and the spatial coordinates, in which the coordinates may depend on a hypothetical, predetermined volume, or on the currently selected field of view. Furthermore, the influence of the concomitant fields can be automatically calculated by the MR system and compared to the threshold that is either predefined or specified by the user, or it can depend on the imaging sequence parameters. Accordingly, possible detrimental effects are mitigated by modifying sequence parameters automatically or by suggesting one or several options to the user.

As a consequence, measurements leading to a bad image quality due to the partial signal loss are prevented. In conventional systems, concomitant field effects were compensated without considering the field of view and the exact gradient assignment, i.e. the correspondence between the logical and physical gradient axes. As a result, to fully avoid detrimental effects, the flexibility of the sequence parameters is limited generally even if the position and the orientation of the current field of view does not require it. With the above described embodiments, some of the parameters are only limited in specific circumstances.

As the effects of concomitant fields are mostly not known to the MR users, the detrimental image quality effects may potentially not be understood or misinterpreted and attributed to other effects. Accordingly, an automatic estimation and mitigation of these detrimental effects on image quality are particularly beneficial.

The embodiments discussed herein can provide a system in which extended guidance or automatic selection of imaging parameters is provided to the MR user. Users who have limited experience in MR imaging and in the underlying physics of MR might especially benefit from the approach discussed above.

What is claimed is:

1. A method for operating a magnetic resonance (MR) system, comprising:

acquiring, in an imaging region using a multi echo imaging sequence in which (i) an RF excitation pulse and (ii) a plurality of RF refocusing pulses are applied as a plurality of applied RF pulses, MR signals of an object under examination;

determining a first accumulated phase of a magnetization in the object under examination due to concomitant magnetic fields occurring between a first pair of consecutive RF pulses of the plurality of applied RF pulses with respect to spatial locations within a currently-selected field of view (FoV) within the imaging region that is used to perform the multi spin echo imaging sequence;

determining a second accumulated phase of the magnetization in the object under examination due to concomitant magnetic fields occurring between a second pair of consecutive RF pulses of the plurality of applied RF pulses in the currently-selected FoV, the first accumulated phase and the second accumulated phase having a predetermined relationship with respect to one another; and when a deviation from the predetermined relationship between the first accumulated phase and the second accumulated phase exceeds a threshold value, increasing a time between the plurality of RF refocusing pulses, and wherein the first accumulated phase and the second accumulated phase in the object under examination are a result of a magnetization in the object under examination that forms a stimulated echo having a different amount of accumulated phase than a magnetization in the object under examination that forms a spin echo.

2. The method according to claim 1, further comprising:
when the deviation from the predetermined relationship exceeds the threshold value,
informing a user of the MR system that the deviation exceeding the threshold value has occurred.

3. The method according to claim 1, comprising:
determining the first and second accumulated phases in a plurality of locations within the imaging region; and
executing the one or more actions when the deviation exceeds the threshold value for each of the plurality of locations.

4. The method according to claim 1, wherein the first accumulated phase and the second accumulated phase are determined without considering gradients applied in a phase encoding direction.

5. The method according to claim 1, wherein the first accumulated phase and the second accumulated phase are determined using gradients applied in a readout direction and a slice selection direction.

6. The method according to claim 1, wherein the first accumulated phase and the second accumulated phase are determined in at least one of the following locations:
in a central location of the currently-selected FoV that is used in the multi spin echo sequence; and
in a plurality of points located on an edge of the currently-selected FoV that is used in the multi spin echo sequence.

7. The method according to claim 1, wherein the threshold value is a predetermined, fixed value.

8. The method according to claim 1, wherein the threshold is determined based on current operating conditions at which the multi spin echo sequence is acquired.

9. The method according to claim 1, wherein the first accumulated phase is determined between the RF excitation pulse and a first refocusing pulse, and
wherein the second accumulated phase is determined between 2 consecutive RF refocusing pulses.

10. The method according to claim 9, wherein the predetermined relationship indicates that the first accumulated phase is half of second accumulated phase, which is calculated by evaluating:

$$\int_{t0}^{t1} BC(t)dt = \frac{1}{2}\int_{t1}^{t2} BC(t)dt = \ldots = \frac{1}{2}\int_{t_{m-1}}^{t_m} BC(t)dt,$$
and wherein the first accumulated phase and the second accumulated phase are determined by evaluating:

$\Phi_c(t0,t1) = \gamma \int_{t0}^{t1} BC(t)dt$, with the concomitant fields BC:

$$BC(t) = \frac{1}{2B0}\left[\left(Gx(t)\ z - \frac{Gz(t)\ x}{2}\right)^2 + \left(Gy(t)\ z - \frac{Gz(t)\ y}{2}\right)^2\right],$$

wherein t0 denotes the time of the RF excitation pulse,
wherein t1, t2, tn, and tn-1 denote respective time points of the refocusing pulses, with each time referring to a center of each respective refocusing pulse,
wherein $\Phi_c$ denotes an accumulated phase between time points t0 and t1,
wherein γ denotes a gyromagnetic ratio, and
wherein B0 denotes a static magnetic field, x/y/z are spatial coordinates, and Gx(t), Gy(t), and Gz(t) are the time-varying gradients applied in these directions.

11. The method according to claim 1, wherein the first and the second accumulated phase are determined using gradient strength values to be used in the multi spin echo imaging sequence.

12. The method according to claim 1, wherein when the currently-selected field of view (FoV) deviates from a central location within the imaging region, the first and the second accumulated phase of the magnetization in the object under examination are determined for the currently selected FoV using a plurality of points located on an edge the imaging region.

13. The method according to claim 1, further comprising:
when the deviation from the predetermined relationship between the first accumulated phase and the second accumulated phase exceeds the threshold value, adjusting amplitudes, durations, or ramp times of applied gradients in accordance with the increased time between the plurality of RF refocusing pulses to reduce the deviation.

14. The method according to claim 1, further comprising:
when the deviation from the predetermined relationship between the first accumulated phase and the second accumulated phase exceeds the threshold value, applying a bipolar gradient including two gradient lobes in a readout direction between the RF excitation pulse and a first one of the plurality of refocusing pulses.

15. The method according to claim 14, wherein the act of applying the bipolar gradient including the two gradient lobes comprises applying the bipolar gradient in accordance with a balanced gradient scheme that provides a compensated zeroth and first gradient moment between respective refocusing RF pulses from among the plurality of RF refocusing pulses.

16. The method according to claim 1, further comprising:
when the deviation from the predetermined relationship exceeds the threshold value, exchanging an assignment of a gradient in a readout direction and a gradient in a phase encoding direction applied to physical gradient axes of the MR system during the multi spin echo imaging sequence.

17. The method according to claim 1, further comprising:
when the deviation from the predetermined relationship exceeds the threshold value, deactivating a flow compensation that is active in at least one of the gradient directions.

18. A magnetic resonance (MR) system, comprising:
an MR scanner configured to acquire MR signals of an object under examination in an imaging region using a multi spin echo imaging sequence in which (i) an RF excitation pulse, and (ii) a plurality of RF refocusing pulses are applied as a plurality of applied RF pulses; and
control circuitry configured to:
determine a first accumulated phase of a magnetization in the object under examination due to concomitant magnetic fields occurring between a first pair of consecutive RF pulses of the applied RF pulses with respect to spatial locations within a currently-selected field of view (FoV) within the imaging region;
determine a second accumulated phase of the magnetization in the object under examination due to concomitant magnetic fields occurring between a second pair of consecutive RF pulses of the applied RF pulses in the at least one location within the currently-selected FoV, the first accumulated phase and the second accumulated phase having a predetermined relationship with respect to one another; and
when a deviation from the predetermined relationship between the first accumulated phase and the second accumulated phase exceeds a threshold value, increasing a time between the plurality of RF refocusing pulses, and
when the first accumulated phase and the second accumulated phase in the object under examination are a result of a magnetization in the object under examination that forms a stimulated echo having a different amount of accumulated phase than a magnetization in the object under examination that forms a spin echo.

19. A non-transitory computer-readable medium having instructions stored thereon that, when executed by control circuitry of a magnetic resonance (MR) system, cause the MR system to:
acquire, in an imaging region using a multi spin echo imaging sequence in which (i) an RF excitation pulse, and (ii) a plurality of RF refocusing pulses are applied as a plurality of applied RF pulses, MR signals of an object under examination;
determine a first accumulated phase of a magnetization in the object under examination due to concomitant magnetic fields occurring between a first pair of consecutive RF pulses of the applied RF pulses with respect to spatial locations within a currently-selected field of view (FoV) within the imaging region;
determine a second accumulated phase of the magnetization in the object under examination due to concomitant magnetic fields occurring between a second pair of consecutive RF pulses of the applied RF pulses in the currently-selected field of view (FoV), the first accumulated phase and the second accumulated phase having a predetermined relationship with respect to one another; and
when a deviation from the predetermined relationship between the first accumulated phase and the second accumulated phase exceeds a threshold value, increasing a time between the plurality of RF refocusing pulses, and wherein the first accumulated phase and the second accumulated phase in the object under examination are a result of a magnetization in the object under examination that forms a stimulated echo having a different amount of accumulated phase than a magnetization in the object under examination that forms a spin echo.

\* \* \* \* \*